（12） United States Patent
Ching

(10) Patent No.: US 9,006,892 B2
(45) Date of Patent: Apr. 14, 2015

(54) SYSTEM AND METHOD FOR 3D INTEGRATED CIRCUIT STACKING

(71) Applicant: Taiwan Semiconductor Manufacturing Company, Ltd., Hsin-Chu (TW)

(72) Inventor: Kai-Ming Ching, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 13/674,611

(22) Filed: Nov. 12, 2012

(65) Prior Publication Data
US 2013/0062766 A1 Mar. 14, 2013

Related U.S. Application Data

(63) Continuation of application No. 12/616,920, filed on Nov. 12, 2009, now Pat. No. 8,309,396.

(60) Provisional application No. 61/147,383, filed on Jan. 26, 2009.

(51) Int. Cl.
*H01L 23/48* (2006.01)
*H01L 23/52* (2006.01)
(Continued)

(52) U.S. Cl.
CPC ............ *H01L 23/5283* (2013.01); *H01L 24/03* (2013.01); *H01L 24/05* (2013.01); *H01L 24/10* (2013.01); *H01L 25/0657* (2013.01); *H01L 25/50* (2013.01); *H01L 24/81* (2013.01); *H01L 2224/02126* (2013.01); *H01L 2224/0361* (2013.01); *H01L 2224/03622* (2013.01); *H01L 2224/0401* (2013.01); *H01L 2224/05558* (2013.01); *H01L 2224/05572* (2013.01); *H01L 2224/05644* (2013.01); *H01L 2224/13009* (2013.01); *H01L 2224/13147* (2013.01); *H01L 2224/13582* (2013.01);
(Continued)

(58) Field of Classification Search
CPC .... H01L 23/498; H01L 23/5283; H01L 24/03
USPC .................. 257/737, 738, E23.068, E23.069
See application file for complete search history.

(56) References Cited

U.S. PATENT DOCUMENTS 6,191,489 B1 2/2001 Igel et al.
6,271,059 B1 8/2001 Bertin et al.
(Continued)

FOREIGN PATENT DOCUMENTS

CN 101364586 * 2/2009
JP 2006339497 A 12/2006

*Primary Examiner* — David S Blum
(74) *Attorney, Agent, or Firm* — Slater & Matsil, L.L.P.

(57) ABSTRACT

A method and system of stacking and aligning a plurality of integrated circuits. The method includes the steps of providing a first integrated circuit having at least one funnel-shaped socket, providing a second integrated circuit, aligning at least one protrusion on the second integrated circuit with the at least one funnel-shaped socket, and bonding the first integrated circuit to the second integrated circuit. The system includes a first integrated circuit having at least one funnel-shaped socket, a metallization-diffusion barrier disposed on the interior of the funnel-shaped socket, and a second integrated circuit. The at least one funnel-shaped socket is adapted to receive a portion of the second integrated circuit.

20 Claims, 13 Drawing Sheets

(51) Int. Cl.
*H01L 29/40* (2006.01)
*H01L 23/528* (2006.01)
*H01L 23/00* (2006.01)
*H01L 25/065* (2006.01)
*H01L 25/00* (2006.01)

(52) U.S. Cl.
CPC ............... *H01L 2224/13644* (2013.01); *H01L 2224/13655* (2013.01); *H01L 2224/16147* (2013.01); *H01L 2224/811* (2013.01); *H01L 2224/81139* (2013.01); *H01L 2224/8114* (2013.01); *H01L 2224/81815* (2013.01); *H01L 2225/06513* (2013.01); *H01L 2225/06555* (2013.01); *H01L 2225/06593* (2013.01); *H01L 2924/01002* (2013.01); *H01L 2924/01015* (2013.01); *H01L 2924/01029* (2013.01); *H01L 2924/01033* (2013.01); *H01L 2924/01079* (2013.01); *H01L 2924/014* (2013.01); *H01L 2924/14* (2013.01); *H01L 2224/131* (2013.01); *H01L 2924/01006* (2013.01); *H01L 2924/01047* (2013.01)

(56) References Cited

U.S. PATENT DOCUMENTS

| | | | |
|---|---|---|---|
| 6,437,451 B2 | 8/2002 | Farnworth et al. | |
| 6,756,305 B1 | 6/2004 | Conn | |
| 6,891,272 B1 * | 5/2005 | Fjelstad et al. | 257/774 |
| 7,348,215 B2 * | 3/2008 | Lee | 438/108 |
| 7,468,292 B2 * | 12/2008 | Yamano | 438/113 |
| 7,557,452 B1 | 7/2009 | Williams et al. | |
| 7,821,107 B2 | 10/2010 | Pratt | |
| 7,919,870 B2 | 4/2011 | Trezza | |
| 7,969,015 B2 | 6/2011 | Trezza | |
| 8,106,507 B2 | 1/2012 | Hirai | |
| 8,253,256 B2 * | 8/2012 | Jo | 257/777 |
| 8,421,200 B2 * | 4/2013 | Tajika et al. | 257/686 |
| 2005/0051904 A1 * | 3/2005 | Kim et al. | 257/777 |
| 2005/0127512 A1 | 6/2005 | Yamagata | |
| 2007/0281497 A1 | 12/2007 | Liu et al. | |
| 2009/0067135 A1 | 3/2009 | Hirai | |
| 2009/0302431 A1 | 12/2009 | Scrudato et al. | |
| 2010/0032814 A1 * | 2/2010 | Cho et al. | 257/659 |
| 2010/0127345 A1 * | 5/2010 | Sanders et al. | 257/528 |

* cited by examiner

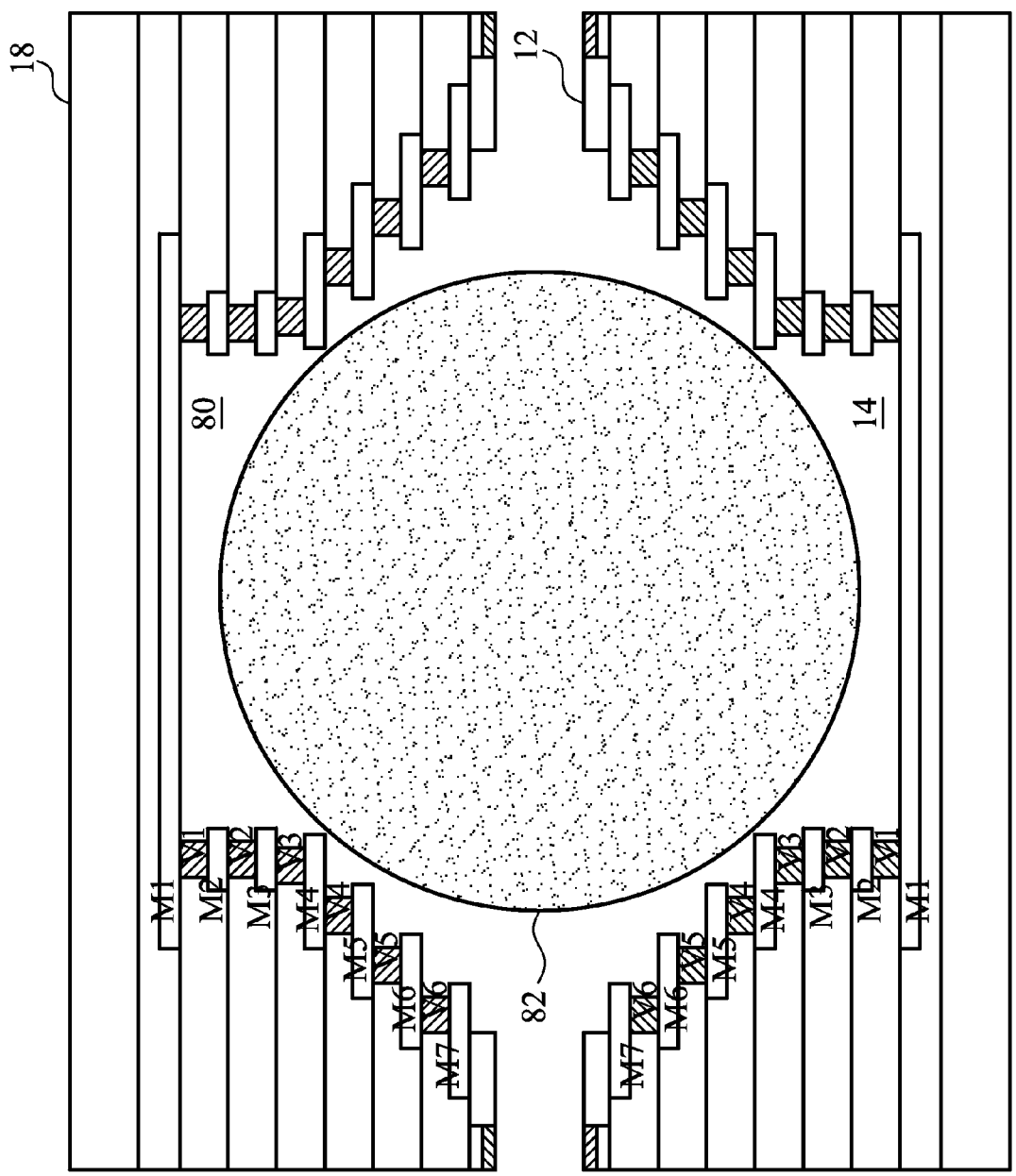

SYSTEM AND METHOD FOR 3D INTEGRATED CIRCUIT STACKING

This application is a continuation of U.S. patent application Ser. No. 12/616,920, now U.S. Pat. No. 8,309,396, filed on Nov. 12, 2009, entitled "System and Method for 3D Integrated Circuit Stacking," which claims the benefit of U.S. Provisional Patent Application Ser. No. 61/147,383, filed on Jan. 26, 2009, entitled "System and Method for 3D Integrated Circuit Stacking," which applications are hereby incorporated herein by reference.

TECHNICAL FIELD

The present invention relates generally to integrated circuits. More particularly, but not by way of limitation, the present invention relates to methods and systems for aligning and stacking integrated circuits.

BACKGROUND

In semiconductor production, it is often necessary to accurately stack and bond two or more integrated circuit chips or wafers to one another. Such alignment and stacking must be carried out with a high degree of accuracy so as to prevent damage to the chips or wafers. As illustrated in FIG. 1, this process traditionally employed "bump to bump" bonding whereby a series of bumps or protrusions on a first chip or wafer was aligned with, and bonded to a corresponding series of bumps or protrusions on a second chip or wafer. As can be seen in FIG. 1, this procedure did not have any means to ensure proper mechanical alignment of the two chips or wafers, and therefore required a bonding tool having a high degree of accuracy. In the case illustrated in FIG. 1, a high degree of misalignment is shown for illustration. Even misalignment of a lesser degree can deleteriously affect the electrical and possibly mechanical properties of the resulting structure, however.

Therefore, there exists a need for a system of stacking and bonding integrated circuits that provides mechanical alignment of the chips or wafers, and reduces the risk of damage.

SUMMARY OF THE INVENTION

In one embodiment, the present invention includes a method of stacking and aligning a plurality of integrated circuits. The method includes the steps of providing a first integrated circuit having at least one funnel-shaped socket, providing a second integrated circuit, aligning at least one protrusion on the second integrated circuit with the at least one funnel-shaped socket, and bonding the first integrated circuit to the second integrated circuit.

In another embodiment, the present invention includes a system for aligning and stacking a plurality of integrated circuits. The system includes a first integrated circuit having at least one funnel-shaped socket, a metallization-diffusion barrier disposed on the interior of the funnel-shaped socket, and a second integrated circuit. The at least one funnel-shaped socket is adapted to receive a portion of the second integrated circuit.

In another embodiment, the present invention includes a method of manufacturing an integrated circuit of the type having an alignment and stacking device. The method includes applying a plurality of etch stop layers, defining the boundaries of an area to be etched, to a dielectric material, applying a photoresist layer to a surface of the dielectric material, etching a funnel-shaped socket in the dielectric material to a pre-determined depth, and applying a metallization-diffusion layer to an interior of the funnel-shaped socket.

In another embodiment, the present invention includes a semiconductor device comprising a conductive region over a substrate and an external dielectric layer located further away from the substrate than the conductive region. A socket extends from the external dielectric layer to the conductive region, the socket being at least partially defined by at least one etch stop layer, wherein the socket has an infundibular shape.

In yet another embodiment, the present invention includes a semiconductor device comprising a plurality of metallization layers over a substrate, the plurality of metallization layers having a top surface and further comprising at least one etch stop layer. A depression extends from the top surface towards the substrate to a conductive region, the depression having a sidewall comprised at least in part by the at least one etch stop layer.

In yet another embodiment, the present invention includes a semiconductor device comprising a first semiconductor die comprising an external electrical connector and a second semiconductor die comprising a depression over a substrate, the depression at least partially extending around the external electrical connector, the depression having a plurality of steps along a sidewall, wherein at least one of the plurality of steps comprises an etch stop layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 is a side elevation view illustrating the operation of an additional embodiment of the present invention.

DETAILED DESCRIPTION OF ILLUSTRATIVE EMBODIMENTS

Various embodiments of the present invention will now be discussed in detail with reference made to the accompanying figures. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Figure 1:
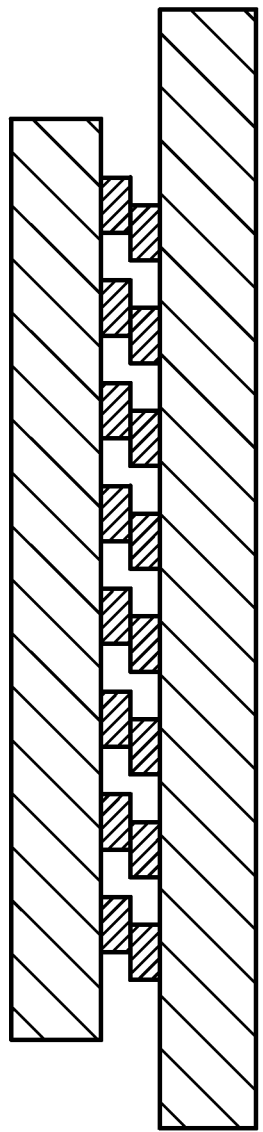
FIG. 1 illustrates a prior art method of stacking and aligning integrated circuits.
Figure 2:
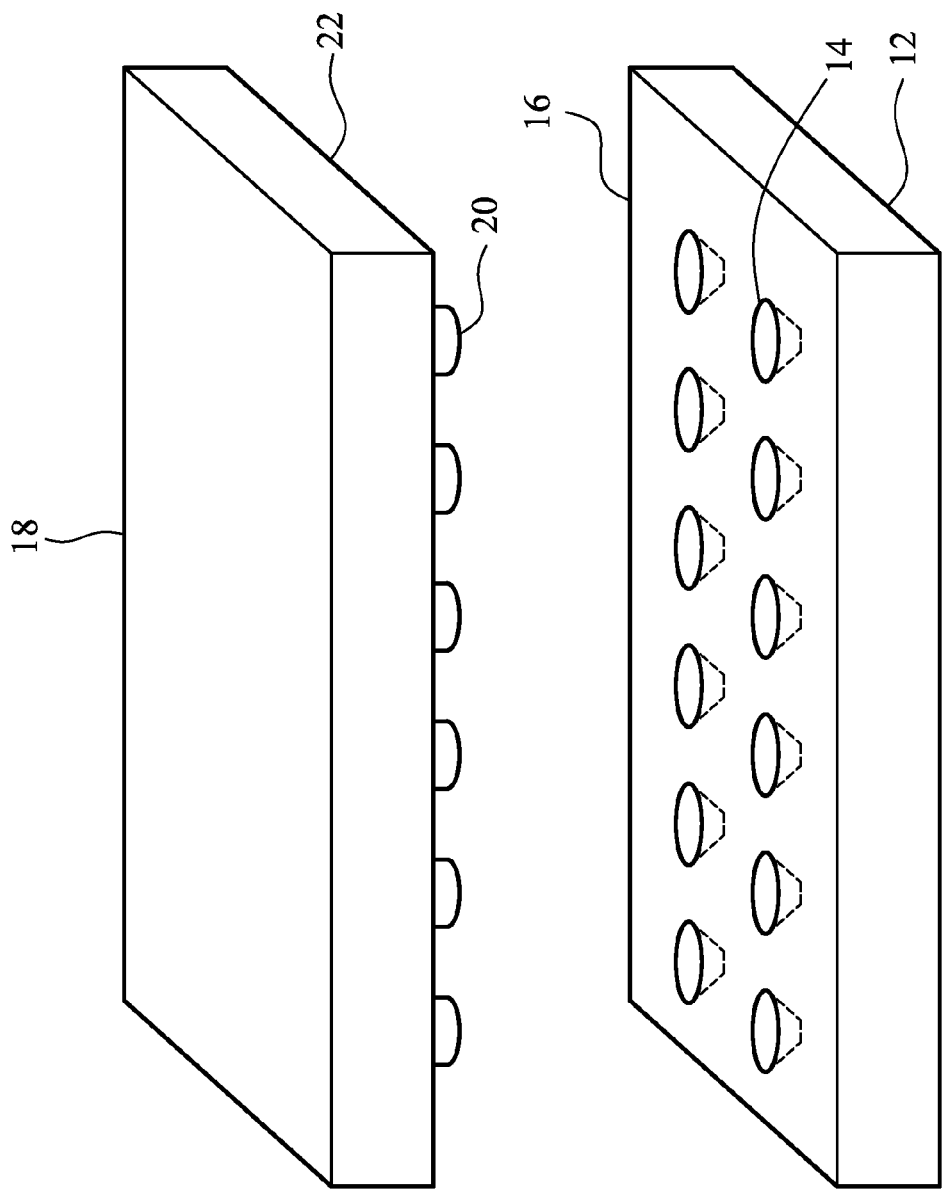
FIG. 2 is a perspective view of a system of aligning and stacking integrated circuits consistent with principles of the present invention.

Referring first to FIG. 2, there is illustrated an embodiment of the present invention. As shown in FIG. 2, a lower chip or wafer 12 has at least one socket 14 disposed on its top surface 16. The sockets 14 may be of any appropriate shape, but typically have a generally circular opening. The walls of the socket 14 extend inward into the body of the lower chip or wafer 12 giving the sockets a generally infundibular or funnel-shaped geometry. In addition, any number of sockets 14 may be disposed on the top surface 16. By way of example, FIG. 2 illustrates twelve such sockets. While sockets 14 are illustrated as being distributed across top surface 16 of lower chip or wafer 12, one skilled in the art will recognize that the present invention may also be embodied in more conventional arrangements, wherein sockets 14 are aligned along the periphery of lower chip or wafer 12, formed only in the center region of top surface 16, or other variations.

Referring still to FIG. 2, an upper chip or wafer 18 has a plurality of bumps or protrusions 20 disposed on a bottom surface 22. Similar to the lower chip or wafer 12, the upper chip or wafer 18 may have any number of bumps or protrusions 20 disposed thereon. However, the number of bumps or protrusions disposed on the bottom surface 22 of the upper chip or wafer 18 preferably corresponds to the number of sockets 14 disposed on the top surface of the lower chip or wafer 12. Accordingly, the upper chip or wafer 18 is shown by way of example as having twelve bumps or protrusions 20 disposed thereon.

Figure 3:
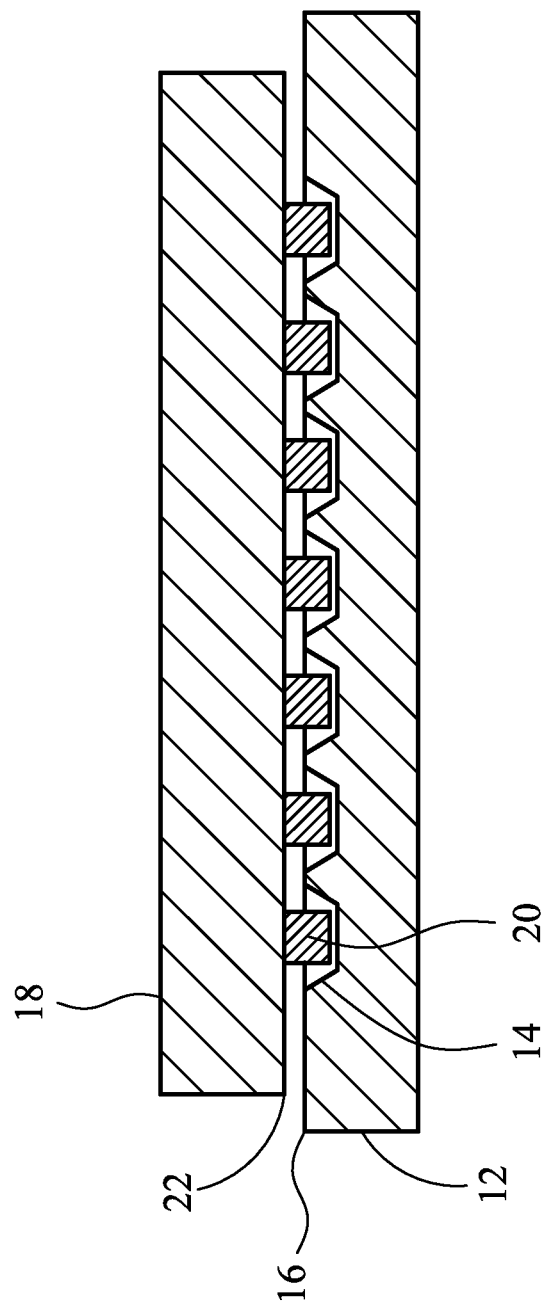
FIG. 3 is a side elevation view of the system of FIG. 2 showing two integrated circuits in a stacked and bonded configuration.

Referring now to FIG. 3, there is shown an illustration of upper chip or wafer 18 stacked and bonded to lower chip or wafer 12. The sockets 14 disposed on the top surface 16 of the lower chip or wafer 12 receive the bumps or protrusions 20 disposed on the bottom surface 22 of the upper chip or wafer 18. The funnel-shaped geometry of the sockets 14 allows for positive alignment of the upper chip or wafer 18 with the lower chip or wafer 12, and reduces both the risk of damaging the upper and lower chip or wafer 12 and 18 as well as the required accuracy, and therefore the overall cost, of the stacking and bonding procedure.

Figure 4A:
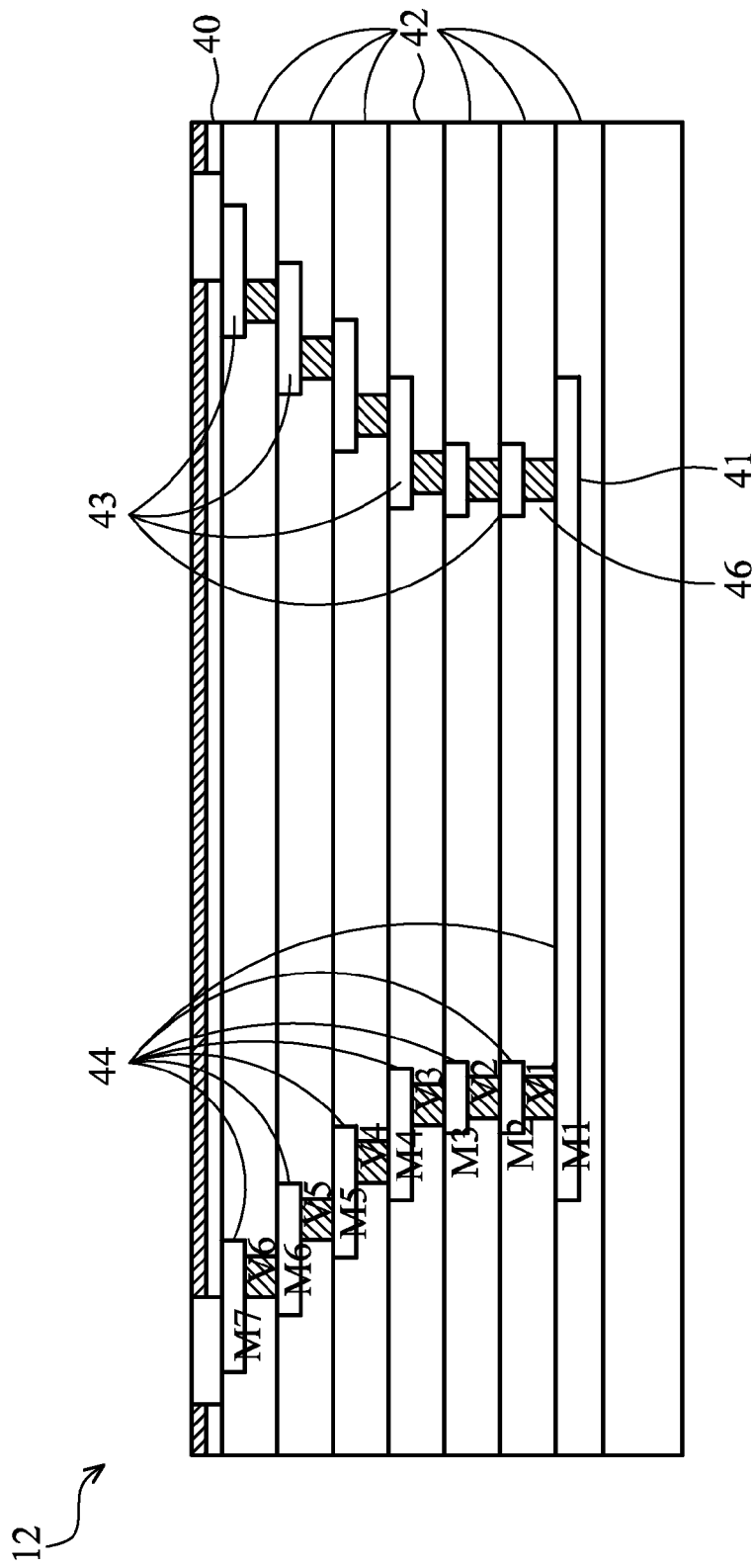
FIGS. 4A-4D illustrate various intermediate steps in the manufacture of an integrated circuit having an alignment socket consistent with principles of the present invention.

Referring now to FIG. 4A-4D, there is illustrated a process for manufacturing an integrated circuit having sockets such as those shown in FIGS. 2 and 3. As shown in FIG. 4A, the lower chip or wafer 12 is typically manufactured from a dielectric material 40. The dielectric material 40 may be any appropriate material such as SiN, $SiO_2$, or SiC. The dielectric material 40 typically consists of several layers 42. Several metal etch stop layers 44 are embedded in the dielectric material 40. The etch stop layers 44 include a plurality of side-wall trenches 46. These side-wall trenches increase the bonding area for solder.

Figure 4B:
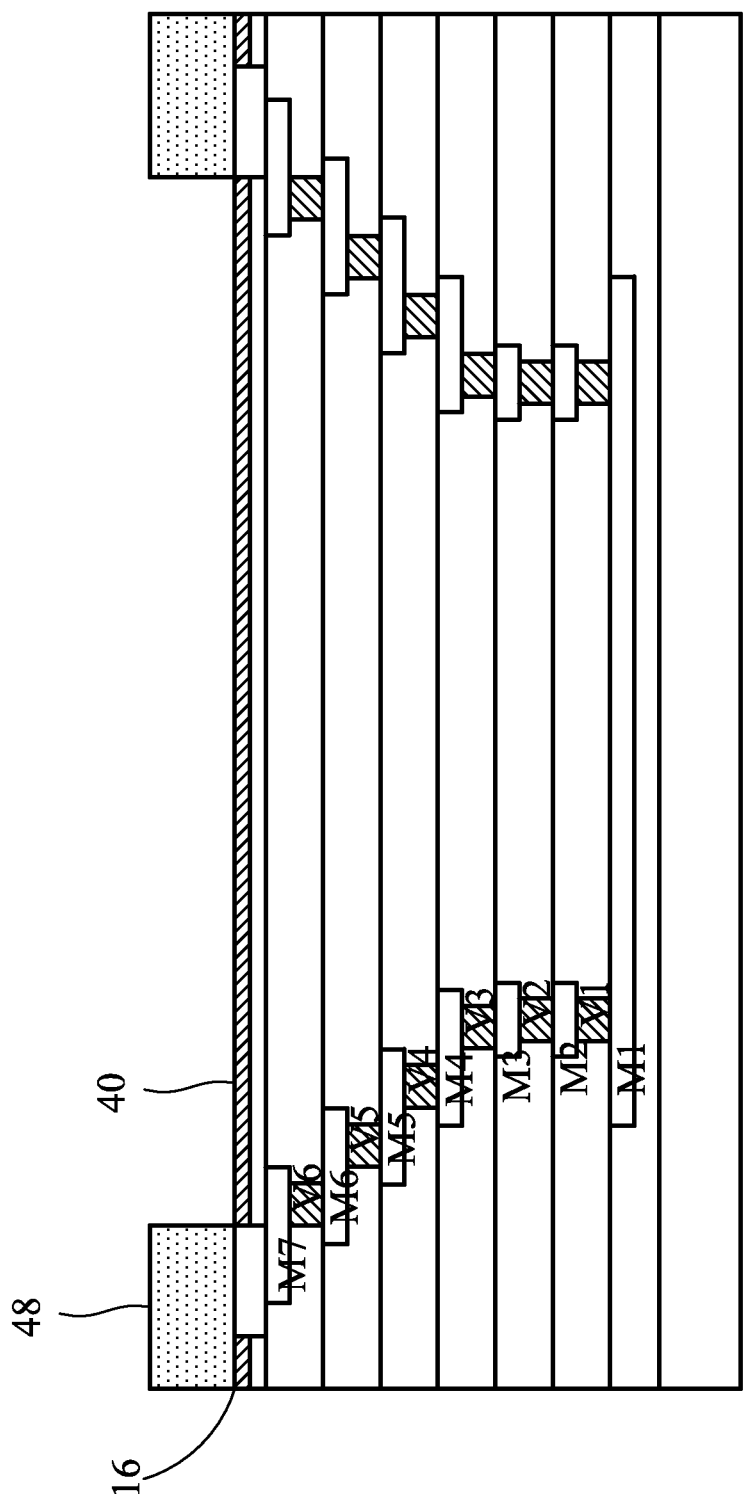
Figure 4C:
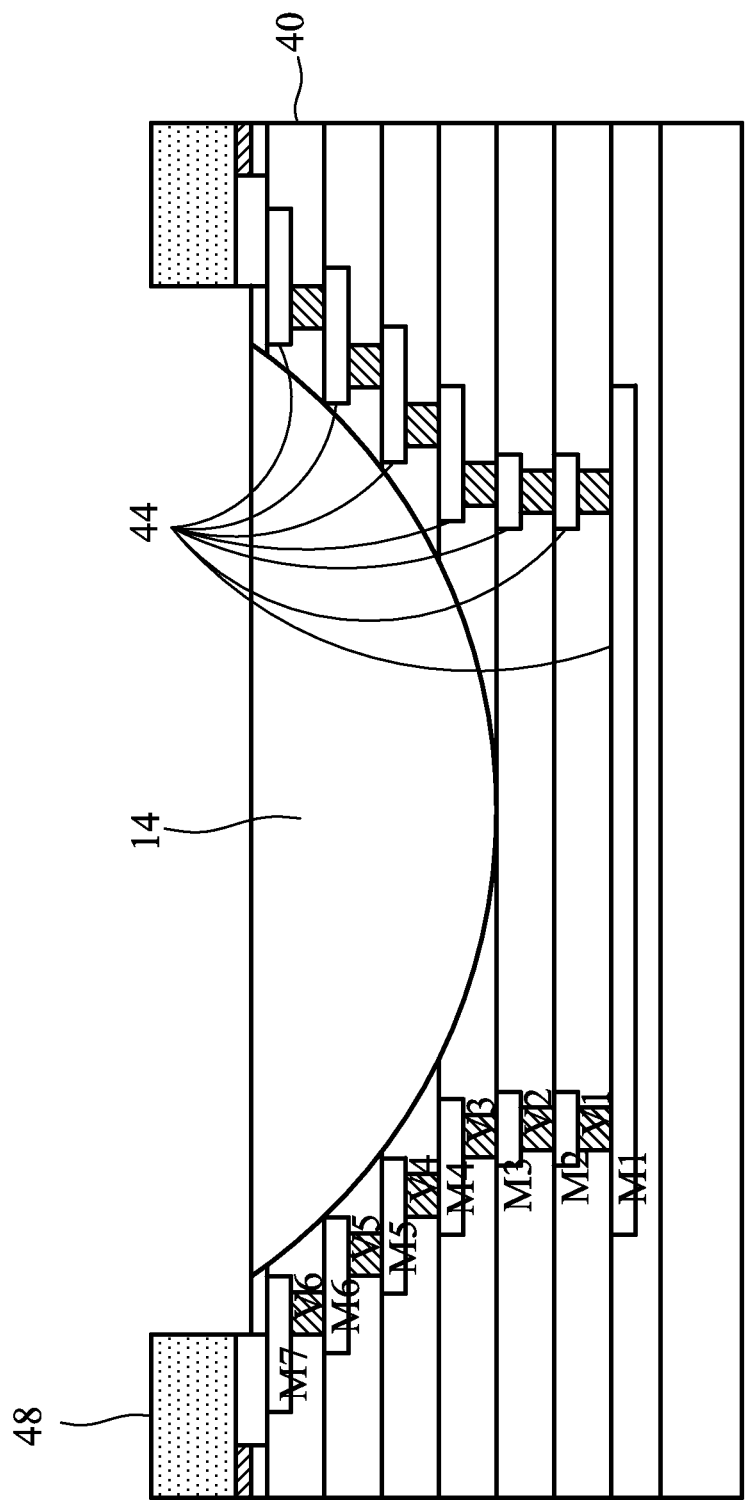
Figure 4D:
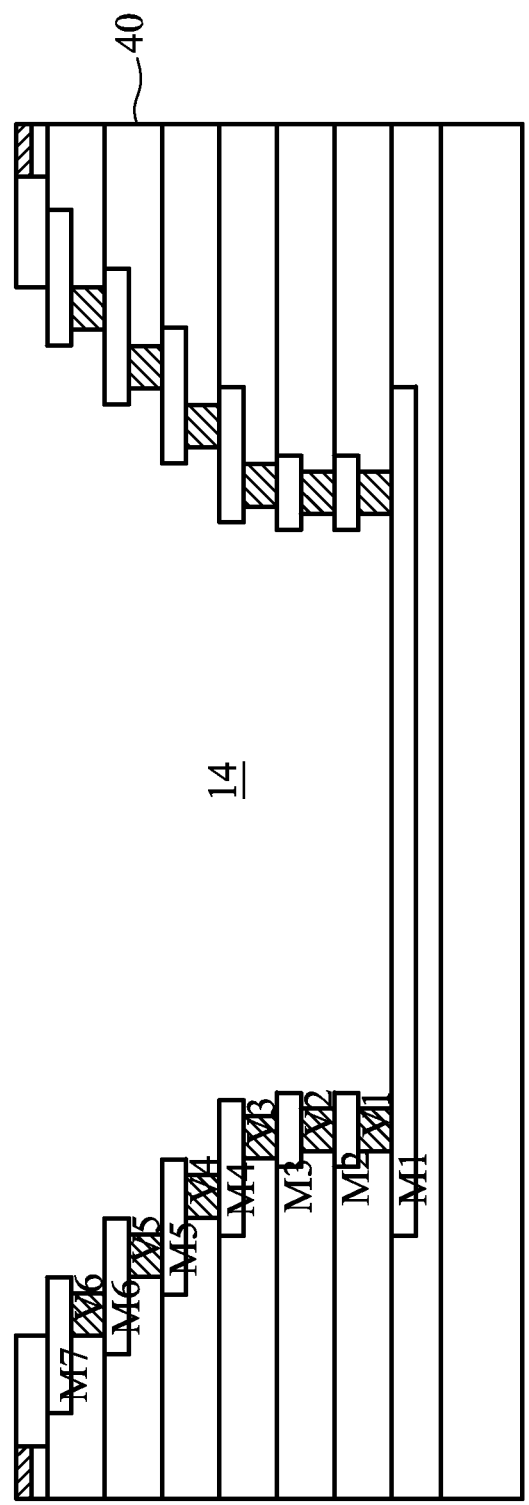

As shown in FIGS. 4B, 4C, and 4D, a photoresist layer 48 is applied to the top surface 16 of the dielectric material 40. The photoresist layer 48 prevents damage to the dielectric material 40 during the etching process. Next, the dielectric material between the etch stop layers 44 is removed by way of an etching process. The etching process may be any appropriate process, but is most preferably either a dry-etch or a wet-etch process. During the etching process the photoresist layer 48 prevents undesired etching of the dielectric material 40. The etch stop layers 44 are resistant to the etching process, and thereby ensure that the socket 14 takes on the desired funnel-shaped geometry. Once the etching process is completed, the photoresist layer 48 may be removed.

Figure 5A:
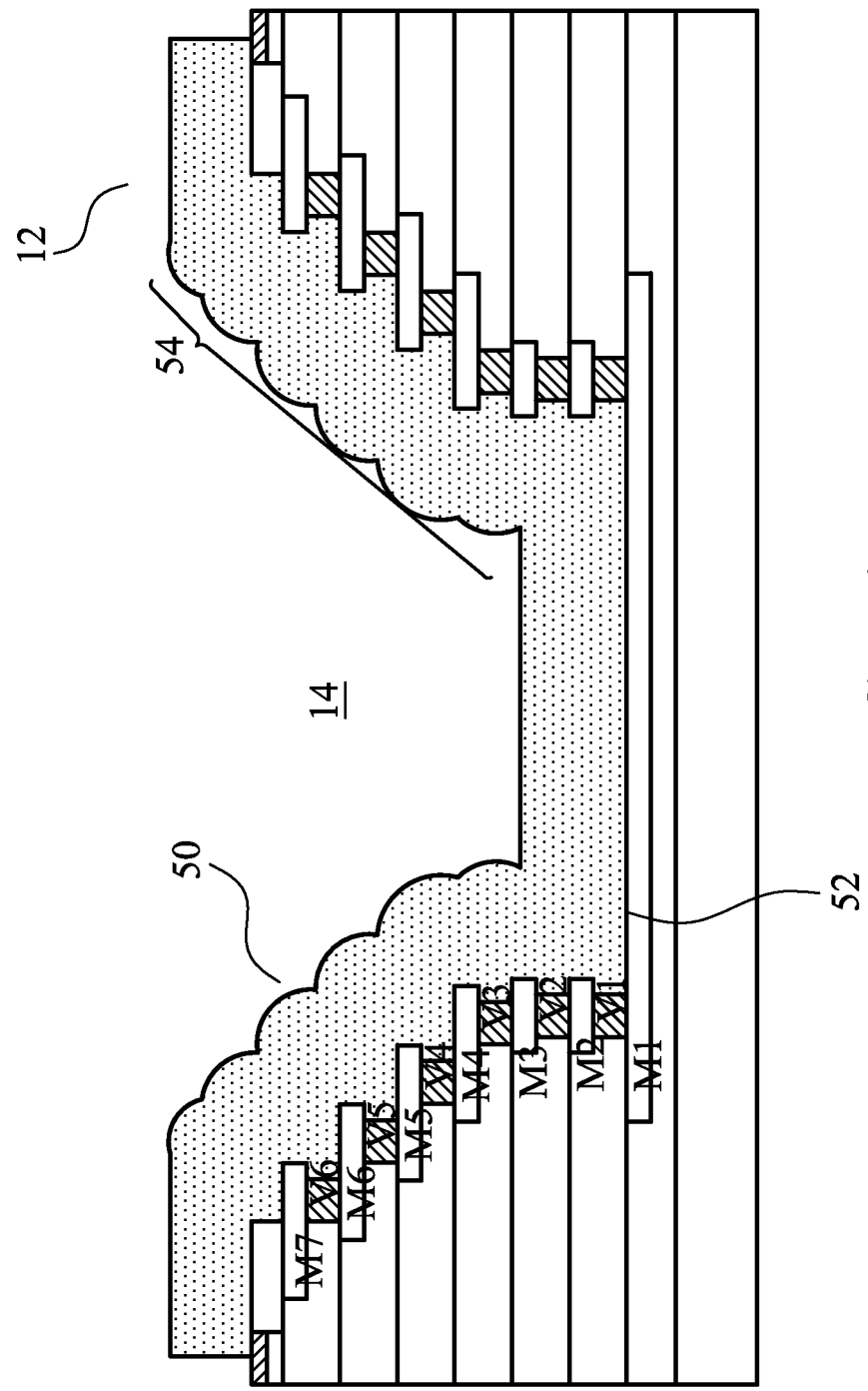
FIGS. 5A-5C are side elevation views illustrating the operation of an embodiment of the present invention.
Figure 5B:
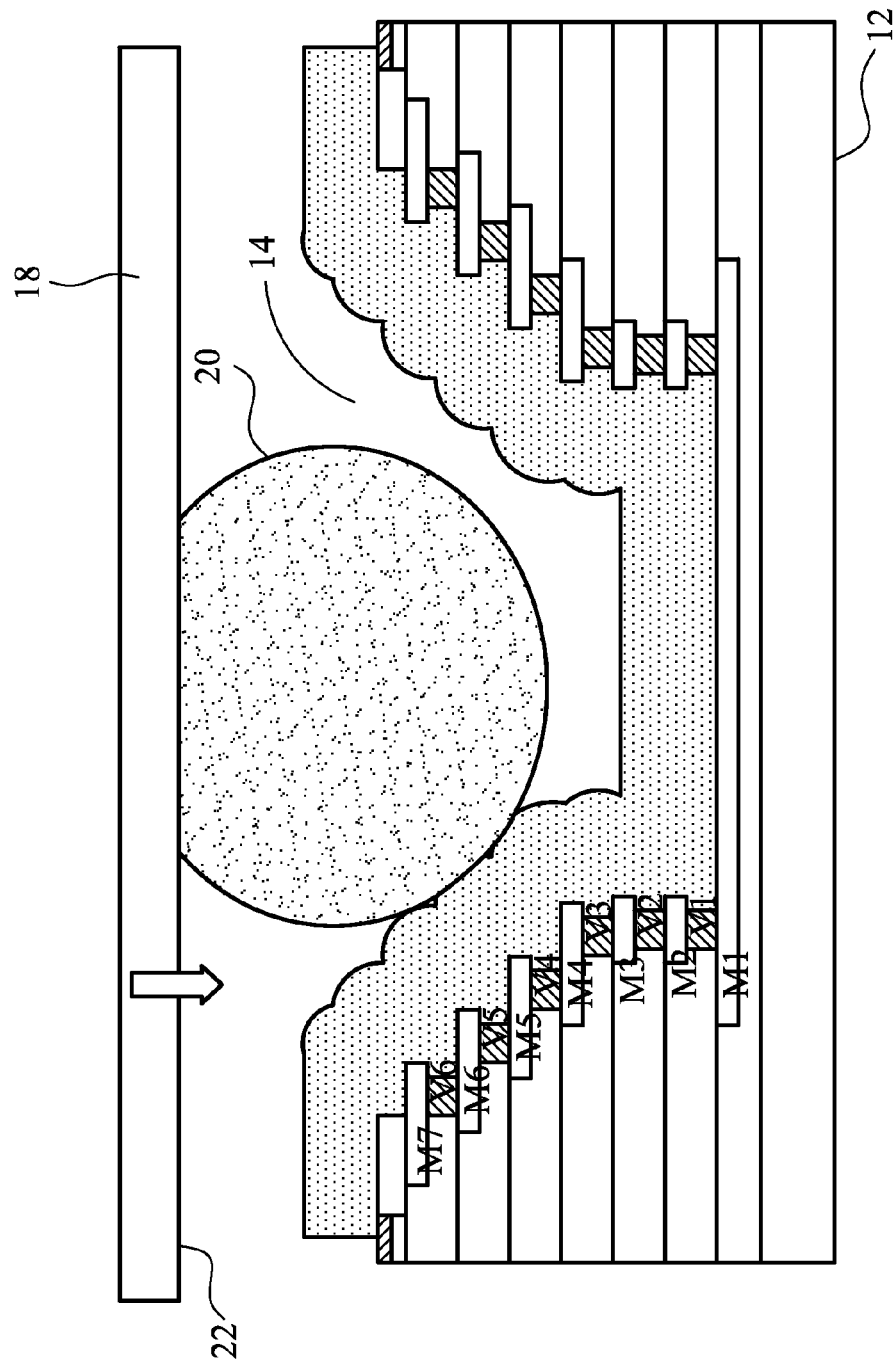
Figure 5C:
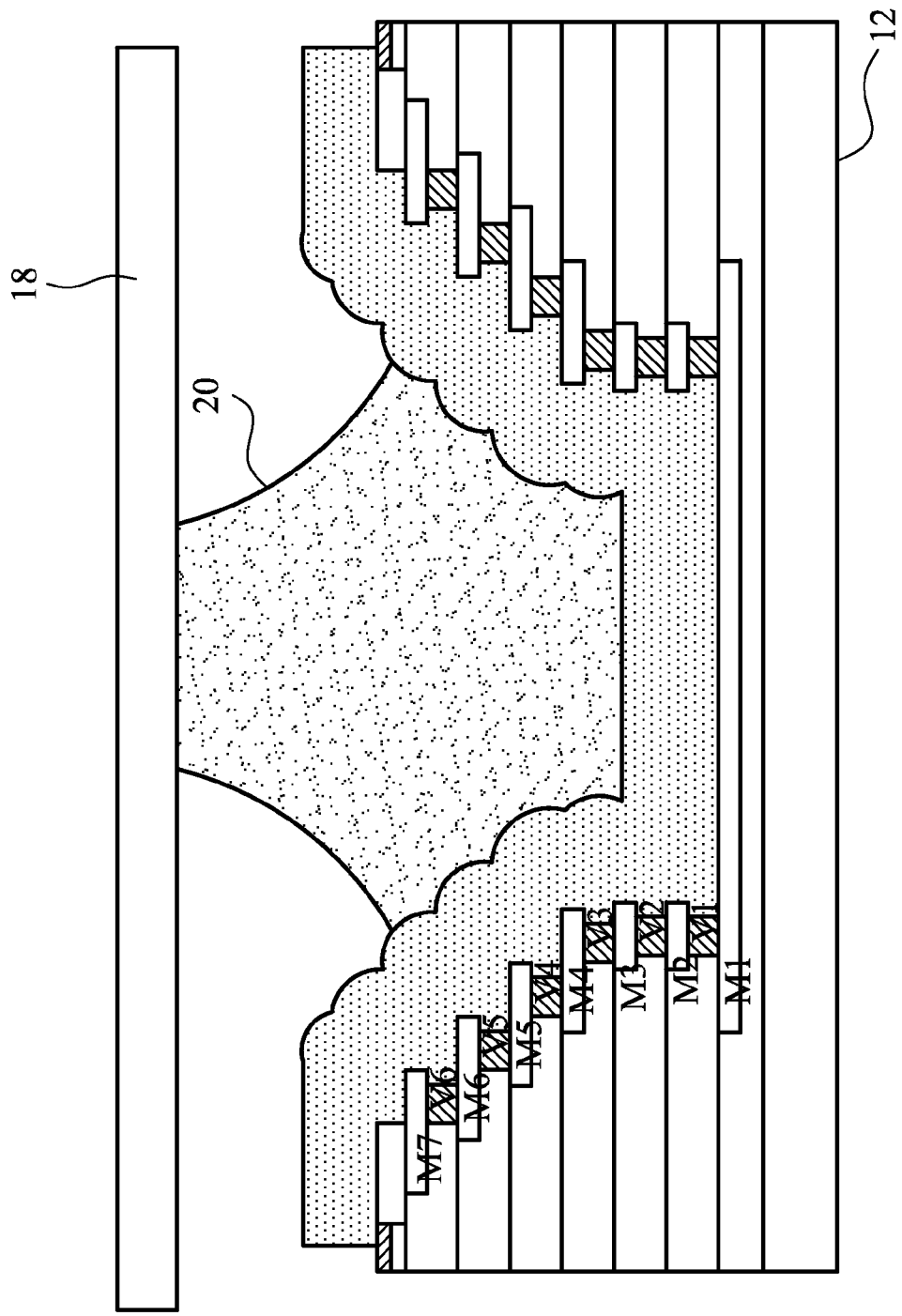

Referring now to FIGS. 5A-5C, there is shown an embodiment of a method for stacking and bonding two integrated circuits. A metallization-diffusion barrier 50 is applied to the interior of the socket 14. The metallization-diffusion barrier typically has a thickness greater than 2 microns, and consists of a diffusion barrier such as, for example, Nickel, and a solder wetting layer such as, for example, gold. The metallization-diffusion barrier 50 serves two purposes. First, the metallization-diffusion barrier 50 can reinforce a bottom layer 52 of the socket 14. Second, the metallization-diffusion barrier 50 can smoothen a socket sidewall 54 for better mechanical bonding alignment.

As shown in FIGS. 5B and 5C, the socket 14 is adapted to receive a bump or protrusion 20 disposed on the bottom surface 22 of the upper chip or wafer 18. By way of example, the bump or protrusion 20 shown in FIG. 5B is illustrated as a solder bump. The smooth sidewall 54 of socket 14 help to properly position and align the upper chip or wafer 18 with the lower chip or wafer 12. Once properly seated within the socket 14, the solder bump bonds to the sidewall 54 thereby bonding the upper and lower chip or wafer 12 and 18.

Figure 6:
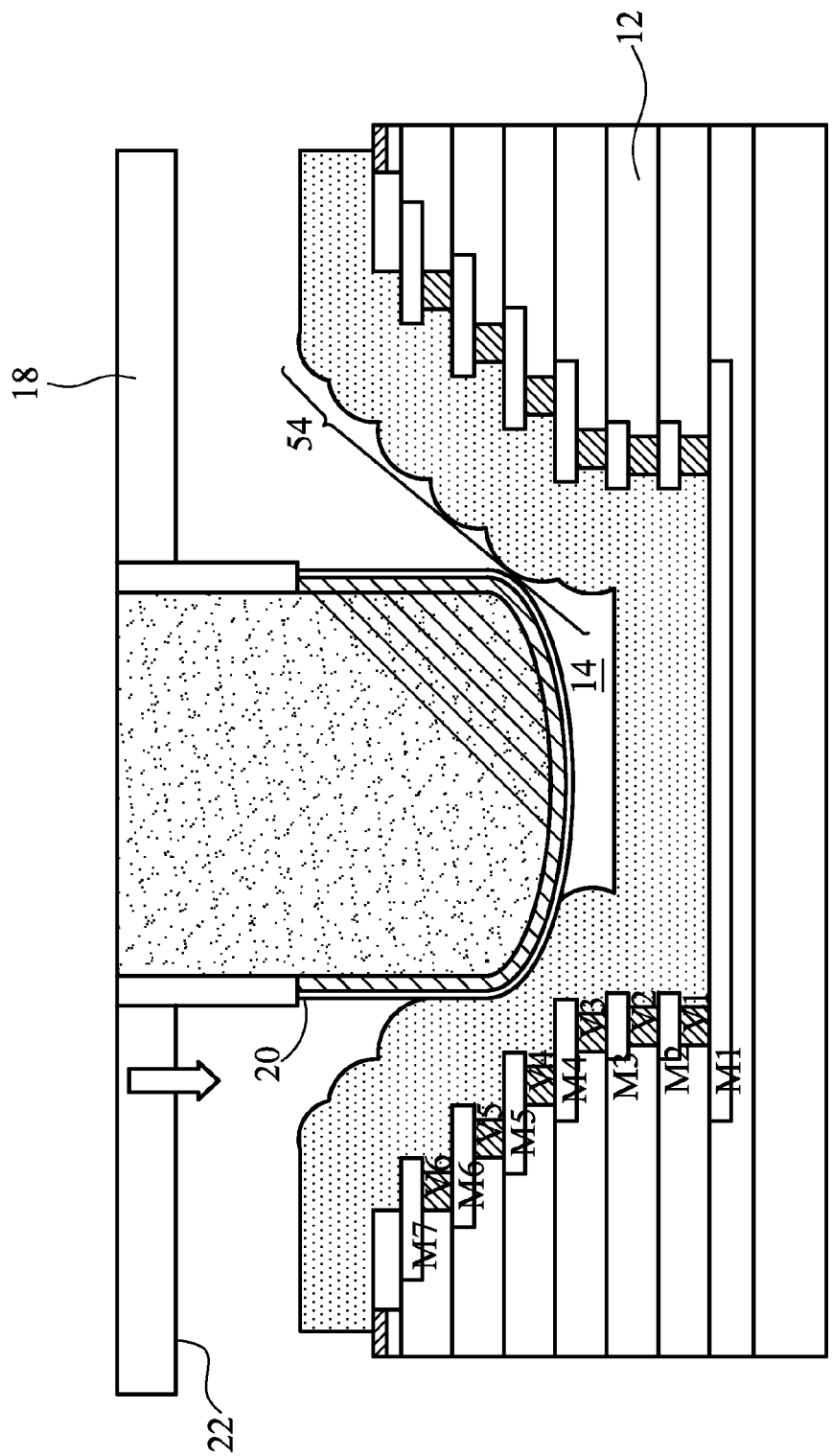
FIG. 6 is a side elevation view illustrating the operation of an additional embodiment of the present invention.

Referring now to FIG. 6, there is shown an embodiment of the present invention wherein the bump or protrusion 20 is illustrated as a Copper bump or a TSV Copper nail protruding from the bottom surface 22 of upper wafer or chip 18. As shown in FIG. 6, the metallization-diffusion barrier 50 can also be applied directly to the bump or protrusion 20 instead of, or in addition to, the application to the sidewall 54 of the socket 14.

Figure 7:
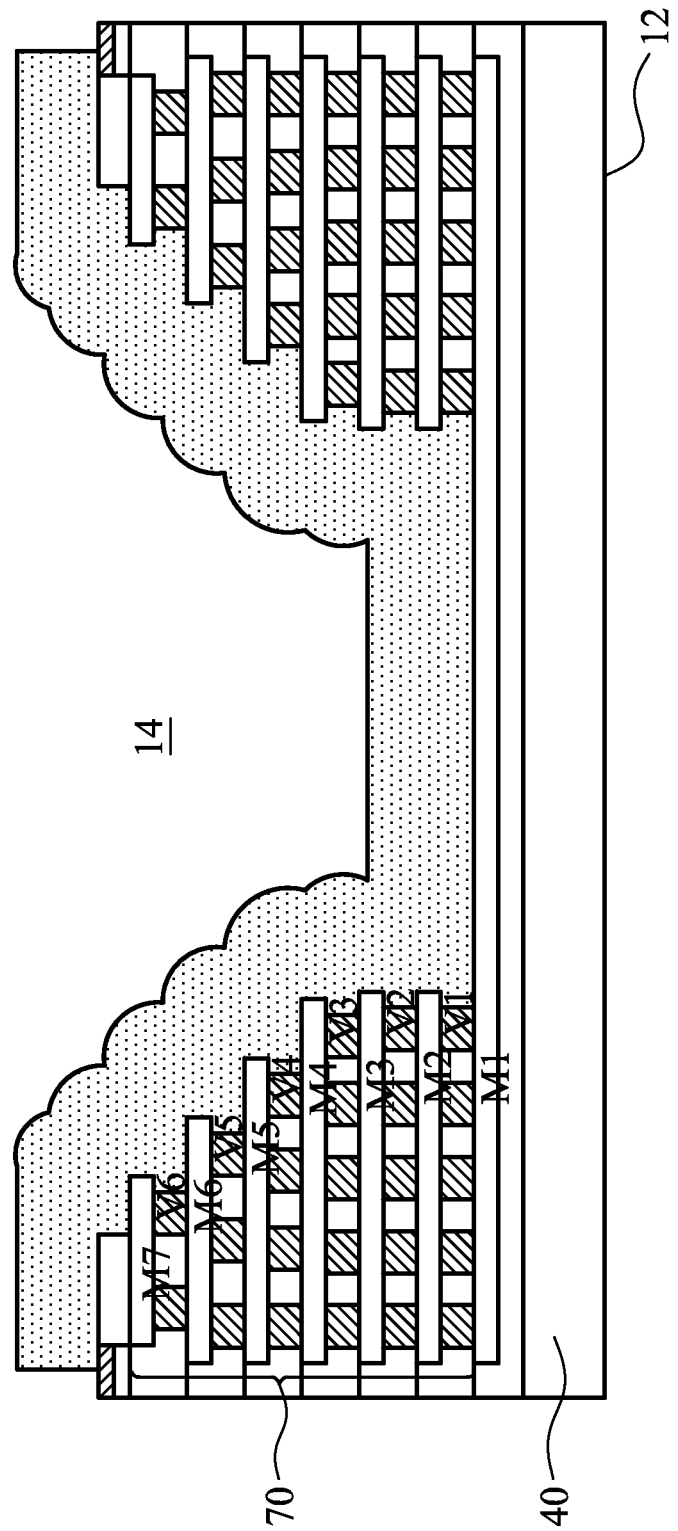
FIG. 7 is a side elevation view illustrating an embodiment of an alignment socket with a reinforcing metal strip array.

Referring now to FIG. 7, there is shown an embodiment of the present invention whereby an array of metal strips 70 is embedded into the dielectric material 40 in the region surrounding the socket 14. The array of metal strips serves to strengthen the dielectric material 40 and form a tough structure for bonding.

Referring now to FIG. 8, there is shown an embodiment of the present invention whereby upper chip or wafer 18 includes a socket 80 corresponding to the socket 14 disposed on the lower chip or wafer 12. During operation a bead of solder 82 is placed between the upper and lower chips or wafers 12 and 18 within the sockets 14 and 80. The angled sidewalls of the sockets 14 and 80 aid in aligning the upper and lower chips or wafers 12 and 18 during bonding.

While various embodiments of the present invention have been described herein as being "preferred", one skilled in the art will appreciate that the invention is capable of numerous modifications, combinations, and rearrangements without departing from the spirit and scope of the present invention as set forth in the following claims. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a single semiconductor chip comprising:
- a conductive region over a substrate;
- an external dielectric layer located further away from the substrate than the conductive region; and
- a socket extending from the external dielectric layer to the conductive region but does not extend through the single semiconductor chip, the socket being at least partially defined by at least one etch stop layer, wherein the socket has an infundibular shape, wherein the infundibular shape has a smaller width at a first distance from the conductive region than at a second distance located further from the conductive region.

2. The semiconductor device of claim 1, further comprising a diffusion barrier located along an interior surface of the socket.

3. The semiconductor device of claim 1, further comprising a conductive connector located within the socket, the conductive connector connected to an integrated circuit comprising a semiconductor substrate.

4. The semiconductor device of claim 3, wherein the conductive connector is a solder bump.

5. The semiconductor device of claim 3, wherein the conductive connector is a copper bump.

6. The semiconductor device of claim 1, wherein the substrate comprises a top surface and the socket is disposed at an angle of about 45 degrees relative to the top surface.

7. The semiconductor device of claim 1, wherein the conductive region is an intermediate metal layer.

8. The semiconductor device of claim 7, wherein the conductive region is a bottom-most metal layer.

9. A semiconductor device comprising:
- a plurality of metallization layers, wherein a first one of the plurality of metallization layers is in physical contact with a substrate, the plurality of metallization layers having a top surface and further comprising at least one etch stop layer; and
- a depression extending from the top surface towards but not through the substrate to a conductive region, the depression having a sidewall comprised at least in part by the at least one etch stop layer, wherein the depression is a funnel shaped depression.

10. The semiconductor device of claim 9, further comprising an external contact within the depression and in electrical connection with the conductive region, wherein the conductive region is part of a first semiconductor die and the external contact is part of a second semiconductor die.

11. The semiconductor device of claim 10, wherein the external contact is a solder ball.

12. The semiconductor device of claim 10, wherein the external contact is a copper bump.

13. The semiconductor device of claim 9, wherein the sidewall is disposed at about a 45 degree angle from a top surface of the substrate.

14. The semiconductor device of claim 9, further comprising a diffusion barrier layer located along the sidewall.

15. A semiconductor device comprising:
- a first semiconductor die comprising an external electrical connector; and
- a second semiconductor die comprising a depression over a substrate, the depression at least partially extending around the external electrical connector but not extending through the second semiconductor die, the depression having a plurality of steps along a sidewall, wherein each step of the plurality of steps comprises a different material than adjacent ones of the plurality of steps and at least one of the plurality of steps comprises an etch stop layer.

16. The semiconductor device of claim 15, wherein the external electrical connector is a solder ball.

17. The semiconductor device of claim 15, wherein the external electrical connector is a copper pillar.

18. The semiconductor device of claim 15, further comprising a barrier layer located along the sidewall of the depression.

19. The semiconductor device of claim 15, wherein the sidewall is disposed at an angle of about 45 degrees from a plane defined by a top surface of the substrate.

20. The semiconductor device of claim 15, wherein the plurality of steps comprises at least one metal layer.

* * * * *